(12) United States Patent
Sprengers et al.

(10) Patent No.: US 10,008,362 B1
(45) Date of Patent: Jun. 26, 2018

(54) OPTICAL FIBER FEEDTHROUGH DEVICE AND FIBER PATH ARRANGEMENT

(71) Applicant: Mapper Lithography IP B.V., Delft (NL)

(72) Inventors: Johannes Petrus Sprengers, The Hague (NL); Christiaan Otten, IJsselstein (NL)

(73) Assignee: Mapper Lithography IP B.V., Delft (NL)

( * ) Notice: Subject to any disclaimer, the term of this patent is extended or adjusted under 35 U.S.C. 154(b) by 0 days. days.

(21) Appl. No.: 15/390,777

(22) Filed: Dec. 27, 2016

(51) Int. Cl.
*H01J 37/18* (2006.01)
*G02B 6/42* (2006.01)
*H01J 37/302* (2006.01)
*H01J 37/317* (2006.01)

(52) U.S. Cl.
CPC .......... *H01J 37/185* (2013.01); *G02B 6/4248* (2013.01); *H01J 37/302* (2013.01); *H01J 37/3174* (2013.01); *H01J 2237/31777* (2013.01)

(58) Field of Classification Search
CPC .................................................. G02B 6/4248
USPC ............................... 250/492.21; 385/86, 138
See application file for complete search history.

(56) References Cited

U.S. PATENT DOCUMENTS

| | | |
|---|---|---|
| 4,296,996 A | 10/1981 | Niiro et al. |
| 4,902,091 A | 2/1990 | Althaus et al. |
| 5,491,300 A | 2/1996 | Huppenthal et al. |
| 5,588,086 A | 12/1996 | Fan |
| 6,219,484 B1 * | 4/2001 | Rhee .................... G02B 6/3636 385/137 |
| 6,305,975 B1 | 10/2001 | Steiner |
| 6,353,698 B1 * | 3/2002 | Talamini, Sr. ....... G02B 6/3636 174/153 G |
| 6,445,869 B1 | 9/2002 | Tanner |
| 6,882,791 B2 * | 4/2005 | Kwon ..................... G02B 6/30 385/114 |

(Continued)

FOREIGN PATENT DOCUMENTS

| | | |
|---|---|---|
| CN | 103791965 A | 5/2014 |
| DE | 3606588 A1 | 9/1987 |

(Continued)

OTHER PUBLICATIONS

Wood and Wood, Hermetic Sealing with Epoxy, pp. 1-3, Mar. 1990.

*Primary Examiner* — Phillip A Johnston
(74) *Attorney, Agent, or Firm* — NLO N.V.; Catherine A. Shultz

(57) ABSTRACT

Fiber feedthrough device (50), for forming a hermetic seal around optical fibers in a flat fiber group (60) with a group width. The device comprises a slotted member and a base (62). The base defines a hole (65) that extends entirely through the base along a feedthrough direction (X), and is adapted to accommodate the slotted member. The slotted member (52) defines first and second surfaces (53) on opposite sides associated with the feedthrough direction, and a side surface (55, 56) facing transverse to the feedthrough direction. The slotted member comprises a slot (58), which extends along the feedthrough direction through the slotted member, and opens into the first and second surfaces and into a longitudinal opening (59) along the side surface. The slot extends transversely into the slotted member up to a slot depth at least equal to the fiber group width.

21 Claims, 5 Drawing Sheets

(56) References Cited

U.S. PATENT DOCUMENTS

| | | | |
|---|---|---|---|
| 6,886,992 B2 * | 5/2005 | Grzegorzewska | G02B 6/3887 385/69 |
| 7,164,142 B2 | 1/2007 | Vishnipolsky et al. | |
| 7,712,973 B2 * | 5/2010 | DiMarco | G02B 6/3857 385/81 |
| 8,242,467 B2 | 8/2012 | Jager et al. | |
| 8,625,953 B2 * | 1/2014 | Kobayashi | G02B 6/4471 385/134 |
| 9,389,382 B2 * | 7/2016 | Blazer | G02B 6/4403 |
| 2002/0145113 A1 | 10/2002 | Sullivan et al. | |
| 2006/0109445 A1 | 5/2006 | Walf et al. | |
| 2010/0157552 A1 | 6/2010 | Thom et al. | |
| 2011/0280538 A1 | 11/2011 | Durrant et al. | |
| 2013/0248245 A1 | 9/2013 | Park et al. | |
| 2014/0057212 A1 * | 2/2014 | Ohishi | H01J 37/3007 430/325 |
| 2016/0187599 A1 | 6/2016 | Li et al. | |
| 2016/0222777 A1 | 8/2016 | LeBlanc et al. | |
| 2016/0266335 A1 * | 9/2016 | Durrant | G02B 6/4448 |

FOREIGN PATENT DOCUMENTS

| | | |
|---|---|---|
| DE | 3720061 A1 | 12/1988 |
| EP | 0096914 A1 | 12/1983 |
| EP | 337141 A1 | 10/1989 |
| EP | 1521108 A1 | 4/2005 |
| EP | 1936750 A1 | 6/2008 |
| FR | 2936322 A1 | 3/2010 |
| JP | 60181709 A | 9/1985 |
| JP | 04195002 | 7/1992 |
| JP | 3311437 B2 | 3/1995 |
| WO | 9809489 A1 | 3/1998 |
| WO | 02/19003 A2 | 3/2002 |
| WO | 2010094719 A1 | 8/2010 |

\* cited by examiner

OPTICAL FIBER FEEDTHROUGH DEVICE AND FIBER PATH ARRANGEMENT

TECHNICAL FIELD

The invention relates to an optical fiber feedthrough device, to an optical fiber path arrangement including at least one such fiber feedthrough device, and to a vacuum chamber and a processing system including such an optical fiber path arrangement.

BACKGROUND ART

In the semiconductor industry, an ever-increasing desire exists to manufacture smaller structures with high accuracy and reliability. Lithography is often a critical part of such manufacturing processes. During lithography processing, the target (e.g. a semiconductor wafer) needs to be situated in a high vacuum environment that is hermetically sealed from the surroundings (e.g. from atmospheric conditions), to reduce the probability of contamination.

In a mask-less lithography system, charged particle beamlets may be used to transfer a pattern onto the target. The beamlets may be individually controllable to obtain the desired pattern. To be commercially viable, mask-less lithography systems need to meet challenging demands for wafer throughput and error margins. A higher throughput may be obtained by using more beamlets. The handling of a greater number of beamlets calls for more sophisticated control devices and circuitry, without compromising the necessary vacuum conditions or significantly increasing the required fab space (i.e. the area covered by the processing unit). The task of arranging more process control devices and/or circuitry in a decreasing available volume while maintaining hermetic seals between various parts of the lithography system becomes more and more challenging.

Patent document U.S. Pat. No. 8,242,467B2, assigned to the current applicant, discloses a multi-beamlet lithography system. This system comprises a beamlet blanker (or modulator) for selectively allowing or denying individual beamlets passage to the target, based on pattern data. The beamlet blanker is arranged near the target in a vacuum chamber, but controlled by a control unit that is located outside the vacuum chamber. The lithography system includes an optic system with an array of optical fibers for transmitting modulated light signals with the pattern data from the control unit to light sensitive blanking actuators on the beamlet blanker. The fibers are routed via an opening in a feedthrough device through a wall of the vacuum chamber. Vacuum compatible sealing material is used to provide an airtight sealing for the fibers in the opening. U.S. Pat. No. 8,242,467B2 presents little details in relation to the structure of the feedthrough device.

Patent document US2016/0787599A1 describes fiber alignment assemblies for hermetically feeding optical fibers through a housing of an opto-electronic module. One such assembly includes a ferrule, with two adjoined ferrule portions. One ferrule portion has a surface with four alignment grooves, which accommodate end sections of optical fibers. The second ferrule portion covers the surface and the alignment grooves of the first ferrule portion, when the ferrule portions are mated together to form the ferrule. Sealant material, such as glass solder, may then be fed into the ferrule, through an aperture in one of the ferrule portions. Vacuum is applied to a pocket in the ferrule, to draw the glass solder through clearances between the optical fibers and grooves, to form a hermetic seal. The hermetic assemblies from US2016/0787599A1 are primarily suitable for feeding through relatively small numbers of individual optical fibers.

It would be desirable to provide a feedthrough device that is suitable for routing a large number of optical fibers (i.e. several tens or hundreds) in an ordered and hermetically sealed manner through a structure that separates two regions with different ambient conditions.

SUMMARY OF INVENTION

Therefore, according to a first aspect of the invention, there is provided an optical fiber feedthrough device for forming a hermetic seal around a plurality of optical fibers. The optical fibers extend along each other to form a flat fiber group with a group width. The feedthrough device comprises a slotted member and a base. The slotted member defines a first surface that faces predominantly towards a feedthrough direction, a second surface that faces predominantly opposite to the feedthrough direction, and a side surface that interconnects the first and second surfaces and faces outwards transverse to the feedthrough direction. The base defines a hole that extends entirely through the base along the feedthrough direction, this hole being adapted to accommodate the slotted member. The slotted member includes at least one slot, which extends along the feedthrough direction through the slotted member, and opens into the first and second surfaces, to allow the fiber group to pass from the first surface through the slotted member to the second surface. The slot further opens into a longitudinal opening, which extends along the side surface. The slot extends from the side surface along a depth direction transverse to the feedthrough direction up to a slot depth into the slotted member. This slot depth is equal to or larger than the group width.

The fibers extend co-directionally and alongside each other, to form the flat fiber group. The fibers may directly abut, or may have some spacing in between. The optical fiber groups may be arranged in the form of ribbons.

The slot forms a narrow groove that extends from the longitudinal opening at the side surface, inwards into the slotted member, and allows a longitudinal portion of the associated fiber group to be easily and reliably inserted into the slotted member during manufacturing of an optical fiber path arrangement. The transverse extent of the slot into the slotted member allows the flat fiber group to be inserted sideways into the slotted member, while leaving a large part of the periphery of the slotted member available for other slots and fiber groups. The slot depth is at least equal to the group width, but may be larger in order to provide additional slot space. This excess slot space may for example be used to insert a retaining wire or strip next to the fiber group into the slot, to block the longitudinal opening and hold the fiber group inside the slot. The proposed arrangement of flat fiber groups and slots allows a large number of fibers (i.e. in the order of tens or hundreds or more) to be routed through the feedthrough device in a hermetically sealed and well-ordered manner.

The slotted member and base have thicknesses (or depths) defined along the feedthrough direction, and cross-sectional areas defined in planes transverse to the feedthrough direction. These dimensions may be adapted to meet specific requirements in relation to differential pressures and structural robustness. For example, the thicknesses of the slotted member and base may be in a range of 5 millimeters to 40 millimeters, and the cross-sectional area of the slotted member may in a range of 100 square millimeters to 1500 square millimeters.

Preferably, the slot has a predominantly rectangular shape, which extends transversely from the longitudinal opening inwards into the slotted member, along a linear trajectory with the slot depth. The slot may have a slot width in a width direction transverse to both the feedthrough direction and the depth direction, which is smaller than the slot depth along the entire depth extent of the slot. This slot width may remain constant along the entire depth extent of the slot. The slot may extend into the slotted member in a direction perpendicular to a local portion of the side surface that borders on the longitudinal opening.

According to an embodiment, the base defines an inner surface that directly surrounds the hole. The base is adapted to accommodate at least part of the slotted member inside the hole, in such a way that the inner surface covers at least part of the side surface and the longitudinal opening of the slotted member.

The arrangement with a slotted member accommodated in and surrounded by a base, can be accurately aligned and is robust. The inner surface of the base covers the longitudinal opening(s) of the slot(s) in the assembled state of the device, and ensures that fiber groups are properly retained within their slot, before a sealing body is applied.

According to a further embodiment, the first surface of the slotted member is recessed along the feedthrough direction relative to a surface of the base that directly surrounds the hole, when the slotted member is accommodated in the hole. The first surface of the slotted member is recessed to such an extent that at least the first surface of the slotted member and the inner surface of the base form a receptacle in which a sealing body can be accommodated.

The resulting receptacle forms a container that allows a sealing body to be formed, by pouring liquid sealant material into the receptacle, and letting this liquid sealant material cure. Gravitational pull may be exploited, to let the liquid sealant material distribute itself across the first surface of the slotted member and cover part of the slot(s) where the fiber group(s) exits the slot (s), to envelop part(s) of the fiber group(s) and provide a hermetic barrier. The liquid sealant material may thereby be drawn into the slot(s), possibly assisted by capillary action, so that the cured sealing body will extend along at least part of the slot(s) in the feedthrough direction. Space between the inner wall of a respective slot and the longitudinal portion of the associated fiber group will thus also become occupied by the sealing body, to yield an improved sealing effect. Such a sealing body covers the first surface of the slotted member and at least the part of the slot where a fiber group exits the slot, to envelop the fiber group and form a hermetic barrier between first and second regions that are outside the slotted member and border on the first and second surfaces of the slotted member, respectively.

This liquid sealant material may for example be a glue, adhesive or resin, for example an epoxy-based glue, adhesive or resin, that adheres to the first surface of the slotted member and to the inner surface of the base adjacent to the liquid sealant material. The viscosity of the uncured glue preferably is sufficiently low to allow the uncured glue to enter the slot(s) and locally envelop a portion of the fiber group inside this slot, but also sufficiently high to prevent the liquid sealant material from flowing through the entire slot and via the second surface out of the slotted member. In the case that a maximum distance between an inner wall of a slot and an outer surface of a fiber within the group inside this slot is always below 0.5 mm, a viscosity in a range of 20 Pa·s to 50 Pa·s may be suitable.

According to embodiments, the side surface of the slotted member has a cross-sectional shape that resembles a stadium or a rounded rectangle. The inner surface of the base around the through hole may have a similar cross-sectional shape, which is adapted to accommodate the slotted member in a form-fitting manner.

A stadium and a rounded rectangle have linear edges and rounded edges, but omit sharp corners. Several manufacturing-related advantages may be obtained by forming the lateral outer and inner surfaces of the slotted member and base with similar cross-sectional shapes of the above-mentioned types. The finite rotational symmetry of such shapes facilitates alignment between the base and the slotted member. The linear edges provide regions in which slots are more easily formed in a mutually parallel and/or regularly distributed manner, which in turn facilitates insertion of fiber groups. Furthermore, the rounded edges promote equal distribution of liquid sealant material along the first surface and slot(s).

According to embodiments, the side surface of the slotted member defines a flat surface portion that extends in a translationally symmetric manner along a direction perpendicular to the feedthrough direction. The longitudinal opening may be located at this flat surface portion, and the at least one slot may extend perpendicular to the flat surface portion into the slotted member.

Forming of the slot(s) and insertion of the fiber group(s) in this slot(s) is facilitated by forming the slotted member with a flat side surface portion and with one or more slots that extend perpendicularly to this flat surface portion into the slotted member.

According to embodiments, the side surface of the slotted member defines a first side surface segment, which is inwardly tapered towards an axis along the feedthrough direction. In addition, the inner surface of the base may be inwardly tapered congruent to the first side surface segment.

This axis corresponds with coinciding central axes of the slotted member and the hole in the base. The inwards tapering implies that the first side surface segment is locally tilted to face partially laterally outwards and partially towards the feedthrough direction. Similarly, the inner surface of the base may be locally tilted to face partially inwards and partially towards the feedthrough direction. Due to the tapering, the slotted member and the hole in the base jointly decrease in size as a function of position along the feedthrough direction. This ensures that the slotted member will automatically find an optimal fitting position in the hole, after which it will be prevented from moving further though the base. Any excess pressure exerted on the first surface of the slotted member will keep the slotted member fixed inside the base. This is advantageous in operational setting wherein the outside pressure exceeds the pressure inside the vacuum chamber. The inwards tapering may extend along at least part of the transverse outer periphery of the slotted member and at least part of the transverse inner periphery of the base. In particular, the inwards tapering may extent along the entire outer and inner peripheries of the slotted member and base, respectively. The inwards peripheral tapering may extend along at least part of the thickness of the slotted member and the base, viewed along the feedthrough direction.

According to further embodiments, the side surface of the slotted member includes a second side surface segment. This second side surface segment is inwardly tapered, chamfered, or filleted towards the axis, but in an opposite manner with respect to the first side surface segment. Alternatively or in addition, the inner surface of the base may include an inner surface segment that is outwardly tapered, chamfered, or filleted away from the axis, such that the second side surface segment and/or inner surface segment define an inwards peripheral recess. This inwards peripheral recess directly borders on the at least one longitudinal opening in the slotted member, and is adapted to accommodate a portion of the sealing body.

The inward peripheral recess, defined by the tapered/chamfered/filleted second side surface segment of the slotted member and/or the tapered/chamfered/filleted inner surface of the base, directly surrounds the first surface of the slotted member and borders on the longitudinal opening(s) of the slot(s). The peripheral recess allows liquid sealant material to partly cover and be drawn into the longitudinal recess(es), in order to embed longitudinal portion(s) of the fiber group(s) inside the slot(s) within sealant material, and improve the hermetic seal provided by the feedthrough device. The inwards/outwards taper/chamfer/fillet may extend along at least part of the transverse outer periphery of the slotted member and at least part of the transverse inner periphery of the base. The tapered/chamfered/filleted regions may for example cover at least those surface regions where slots reside, or may alternatively extend around the entire transverse peripheries. The height of the taper/chamfer/fillet along the feedthrough direction is preferably limited to the region near the first surface of the slotted member.

According to embodiments, the slotted member and the base form rigid bodies that consist essentially of one or more solid materials.

The solid materials for the slotted member and the base preferably have no or negligible viscoelastic properties, at least in the typical operational temperatures and typical differential pressures between the first and second regions associated with the two hermetically sealed sides of the feedthrough device. The geometries of these bodies thus remain intact, even under varying pressure and temperature conditions. The solid materials are preferably selected from the group of metals or metal alloys that are solid at room temperature, and have low outgassing rates in vacuum. For example, the slotted member and the base may consist (essentially) of aluminum, in view of machinability and vacuum compatibility requirements. Other solid materials may be used for forming the slotted member and the base, and a suitable alternative adhesive material may be used that bonds to the surfaces of the slotted member and the base. The sealing body may be formed from liquid sealant material that adheres to the one or more solid materials and fixes the slotted member to the base, when cured.

According to a second aspect of the invention, and in accordance with the advantages and effects discussed herein above with reference to the first aspect, there is provided an optical fiber path arrangement including optical fibers, a fiber feedthrough device according to the first aspect, and a sealing body. The slotted member is accommodated in the hole of the base. The optical fibers extend along each other to form a flat fiber group with a group width. The fiber group is arranged with a longitudinal portion inside the slot of the slotted member, in order to extend between the first and second surfaces of the slotted member through the fiber feedthrough device. The sealing body covers the first surface of the slotted member and at least the part of the slot where the fiber group exits the slot, to envelop the fiber group and provide a hermetic barrier between first and second (distinct) regions, which are outside the slotted member and border on the first and second surfaces of the slotted member respectively.

The sealing body may be a thermosetting material. In one embodiment, it may comprise an epoxy based material, preferably a two-component epoxy e.g. comprising a modified amine hardener. Suitable candidates may be those that have low outgassing properties. The sealing body may also be distinguished over elastomer-based seals by its high hardness. Preferably, the sealing body has a Shore D hardness of greater than 50. The viscosity of uncured liquid sealant material is preferably sufficiently low to allow it to enter the slot(s) and locally envelop the fiber group inside this slot, but also sufficiently high to prevent the liquid sealant material from flowing through the entire slot and via the second surface out of the slotted member. In the case that a maximum distance between an inner wall of a slot and an outer surface of a fiber within the group inside this slot is always below 0.5 mm, a viscosity in a range of 20 Pa·s to 50 Pa·s may be suitable.

According to an embodiment, the optical fiber path arrangement comprises further optical fibers, which extend alongside each other in arrays to form further fiber groups with group widths. The slotted member may include further slots, which extend along the feedthrough direction through the slotted member and open into the first and second surfaces to allow the fiber groups to pass from the first surface through the slotted member to the second surface. Each slot may further open into a respective longitudinal opening along the side surface of the slotted member, and extend from the side surface up to a slot depth into the slotted member. The sealing body covers all slots to form the hermetic barrier.

The optical fiber path arrangement may thus route multiple flat groups of optical fibers via separate slots through the feedthrough device, while retaining all fibers in a well-defined spatial order. The optical fiber path arrangement may comprise one or more fiber feedthrough devices.

The longitudinal openings may be provided on the same and/or on opposite flat surface portions of the side surface of the slotted member. A multitude of fiber groups is easier to insert into a plurality of slots, if the slots are located in such flat lateral surface portions.

According to an embodiment, the optical fibers have a fiber diameter $Øf$ and are arranged alongside each other into a single-layered array, to form the fiber group with a group thickness that is at least equal to the fiber diameter but smaller than twice the fiber diameter.

By arranging the fibers alongside into a single-layered array to form a flat fiber group, the ordering of the fibers within one group remains uniquely defined and clearly identifiable, even after longitudinal portions of the fiber groups have been enclosed in the slotted member and embedded within the sealing body after completion of the device. A grouping of fibers into a single-layered array implies that fibers have at most two nearest neighbors within the fiber group. Formation of a two-dimensional stacking of fibers and 2D-enclosure of a void by the fibers is thus avoided. The axial centers of the fibers may have varying positions in a transverse (thickness) direction, to yield a group thickness $Hf$ that exceeds the fiber diameter. For cylindrical fibers with circular outer cross-sections $Øf$, the group thickness $Hf$ preferably stays within a range $Øf \leq Hf < 1.86 \cdot Øf$.

According to a further embodiment, the slot has a slot width $\Delta Ys$ transverse to both the feedthrough direction and the slot depth ΔZs, and the slot width ΔYs is within a range defined by Øf<ΔYs<2·Øf, with Øf the outer diameter of the fibers.

By providing slots with a width ΔYs in the specified range, each flat single-layered group of fibers may be accommodated in an associated slot, while the slot prevents fibers of the same group from crossing each other and/or from forming a multi-layered array. Hence, the fibers stay in their predetermined spatial arrangement. Preferably, the slot width ΔYs is within a range Øf<ΔYs<1.86·Øf, or more preferably within a range Øf<ΔYs<1.5·Øf. The slot thus prevents fibers within the same group from forming a staggered dual-layered group of fibers.

According to embodiments, the slotted member and the base of the optical fiber path arrangement consist essentially of solid materials, and the optical fibers are coated on outer surfaces with a material that is essentially the same as the material of the slotted member.

The sealing body may then be formed from an adhesive-sealant material that is optimized for bonding to the coating on the outer surfaces of the coated fibers and the slotted member. The optical fibers may for example be coated with a solid metal, such as aluminum. Such a metal (e.g. aluminum) coating reduces outgassing of the fibers inside the vacuum chamber.

According to embodiments, the fiber group comprises a first connector at a first end that is located in the first region (e.g. associated with the inside of a vacuum chamber), or a second connector at an opposite second end that is located in the second region (e.g. associated with the outside of a vacuum chamber), or connectors at both ends. Alternatively or in addition, further fiber groups may include similar connectors at one or both ends. The connectors may be grouped to form connector panels, to improve manageability and structural robustness of the optical fiber path arrangement. The first connector and/or the second connector may for example be multipole connectors.

The fiber path arrangement may include a panel onto which the one or more feedthrough devices are mounted. Such a panel may form a wall part that is sealingly attachable to and removable from a larger structure, like a wall of a vacuum chamber. The resulting modularity of the fiber path arrangement facilitates manufacturing and/or maintenance.

According to a third aspect, and in accordance with the advantages and effects discussed herein above with reference to the previous aspects, there is provided a vacuum chamber. The vacuum chamber comprises at least one wall and an optical fiber path arrangement in accordance with the second aspect, which is provided at or in the wall. The at least one group of optical fibers in the fiber path arrangement extends from a first region on one side of the wall, via the fiber feedthrough device through the wall, to a second region on an opposite side of the wall.

According to a fourth aspect, and in accordance with the advantages and effects discussed herein above with reference to the previous aspects, there is provided a target processing system, which comprises a vacuum chamber according to the third aspect. The target processing system may be a lithography processing system, for example a charged particle beam lithography system or an electromagnetic beam lithography system.

According to an embodiment, the target processing system is configured to generate and project beams of radiation towards a target inside the vacuum chamber. The target processing system may comprise a beam switching module, which is arranged inside the vacuum chamber, and is configured to modulate and/or select beams for projection onto the target based on control signals. The optical fiber path arrangement may be adapted to transmit the control signals from a control unit external to the vacuum chamber, via the optical fibers that extend through the fiber feedthrough device, to the beam switching module.

The slotted member, and its various features and advantages, may in and of itself be considered a further aspect of the invention.

BRIEF DESCRIPTION OF DRAWINGS

Embodiments will now be described, by way of example only, with reference to the accompanying schematic drawings in which corresponding reference symbols indicate corresponding parts. In the drawings, like numerals designate like elements. Multiple instances of an element may each include separate letters appended to the reference number. For example, two instances of a particular element "20" may be labelled as "20a" and "20b". The reference number may be used without an appended letter (e.g. "20") to generally refer to an unspecified instance or to all instances of that element, while the reference number will include an appended letter (e.g. "20a") to refer to a specific instance of the element.

The figures are meant for illustrative purposes only, and do not serve as restriction of the scope or the protection as laid down by the claims.

DESCRIPTION OF EMBODIMENTS

The following is a description of certain embodiments of the invention, given by way of example only and with reference to the figures. In the figures, Cartesian coordinates will be used to describe spatial relations for exemplary embodiments of the feedthrough device, fiber path arrangement, vacuum chamber, and processing system. Reference symbols X, Y, and Z are used to indicate first, second, and third orthogonal directions, respectively, and may include distinct subscripts to indicate directional definitions for different objects. A plus or minus sign is used to specifically indicate a positive or negative direction, or omitted if the sign is clear from the context or immaterial.

It should be understood that the directional definitions and preferred orientations presented herein merely serve to elucidate geometrical relations for specific embodiments. The concepts discussed herein are not limited to these directional definitions and preferred orientations. Similarly, directional terms such as "top," "bottom," "left," "right," "up," "down," "upper," "lower," "proximal," "distal" and the like, are used herein solely to indicate relative directions and are not otherwise intended to limit the scope of the invention or claims.

The term "surface" is used herein to generally refer to a two-dimensional parametric surface region, which may have either an entirely flat shape (i.e. a plane), a piece-wise flat shape (e.g. a polygonal surface), a curved shape (e.g. cylindrical, spherical, parabolic surface, etc.), a recessed shape (e.g. stepped or undulated surface), or a more complex shape. The term "plane" is used herein to refer to a flat surface defined by three non-coinciding points.

Figure 1:
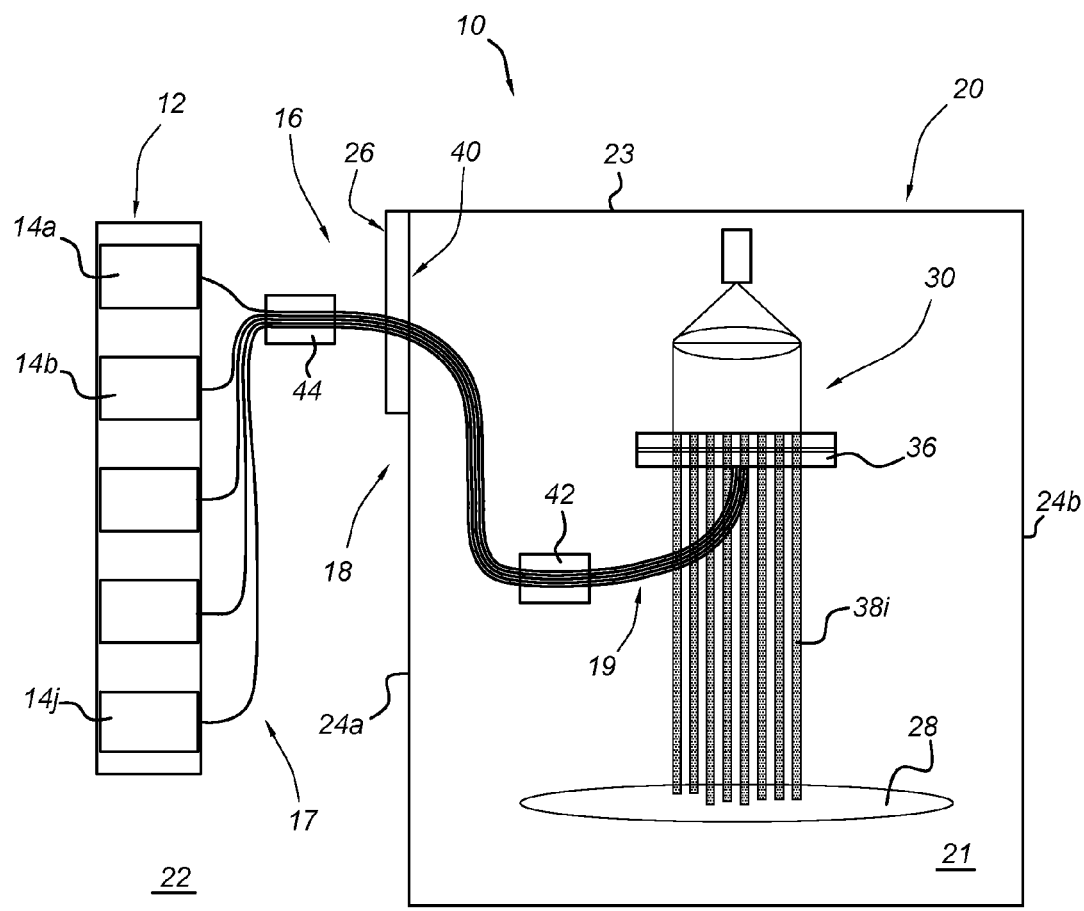
FIG. 1 schematically shows a target processing system including an optical fiber path according to an embodiment.

FIG. 1 schematically shows a target processing system 10 with a vacuum chamber 20 and an optical fiber path arrangement 40. Optical fiber cabling 16 is hermetically passed through a chamber wall 23, 24 that separates two regions 21, 22 with different ambient conditions. In this exemplary embodiment, the target processing system 10 is a charged particle lithography system, which is adapted for lithographic processing of a semiconductor target 28 e.g. to create structures onto a resist-covered semiconductor substrate. Here, the different ambient conditions involve pressure differences.

The target processing system 10 comprises a vacuum chamber 20, and a particle beam projection column 30. The vacuum chamber 20 is configured to maintain a vacuum environment in the inner region 21. This vacuum environment corresponds with a chamber pressure $P_i$ of $10^{-3}$ millibar or lower, for example a pressure range of $10^{-7}$ millibar to $10^{-4}$ millibar. The target processing system 10 comprises or is coupled to evacuation means, for example a vacuum pump system (not shown), which is configured to evacuate (i.e. withdraw air and/or gas from) the vacuum chamber 20.

The target processing system 10 also comprises a control unit 12. This controller 12 may be located outside the vacuum chamber 20, for example in a separate cabinet that is positioned on top of the vacuum chamber 20 (not shown).

The projection column 30 is accommodated inside the vacuum chamber 20, and is adapted to generate, shape, and project one or more charged particle beams, for example electron beamlets 38, toward the target 28. The target 28 is also located inside the vacuum chamber 20 during lithographic processing. The projection column 30 may comprise various optical elements, among which are means for forming the plurality of beamlets 38, and a beam switching module 36. The beam switching module 36 is controllable by optical signals, to modulate and select beamlets 38 for projection onto a surface of the target 28.

The vacuum chamber 20 is formed by multiple walls 23, 24, which are mechanically interconnected and form an impermeable material barrier between the chambers inner region 21 and the region 22 outside the vacuum chamber 20. On one lateral wall 24a, the vacuum chamber 20 includes a feedthrough section 26, which comprises the optical fiber path arrangement 40. In this exemplary embodiment, the feedthrough section 26 of the optical fiber path arrangement 40 includes a relatively flat panel structure, with two opposite panel surfaces that face laterally into and outwards from the vacuum chamber 20, respectively. The fiber path arrangement 40 is provided with a plurality of feedthrough devices 50, which are adapted for routing groups 60 of optical fibers 61 through the feedthrough section 26 of lateral wall 24a.

These optical fibers 61 are part of the optical fiber cabling 16, which traverses the outer region 22, and passes in a hermetically sealed manner through the feedthrough section 26 of the lateral wall 24a, to the inner region 21. The optical fiber cabling 16 includes a sequence of interconnected cable segments 17, 18, 19. A first cabling segment 17 is located in the outer region 22, and is subjected to external ambient conditions (which in this example corresponds to a normal atmospheric pressure $P_0$). The second cabling segment 18 extends through the wall section 26, and is partly located in the outer region 20, and partly located in the inner region 21, the latter region being associated with processing conditions (which in this case corresponds to the low pressure $P_i$). The third cabling segment 19 is located entirely in the inner region 21, and extends through the vacuum chamber 20 towards the beam switcher module 36. Fiber groups in the second cabling segment 18 comprise an ordered group of first connectors 42 at a first end that is located in the inner region 21, and an ordered group of second connectors 44 at an opposite second end that is located in the outer region 22. The first and second connectors 42, 44 may for example be multipole connectors.

Figure 2:
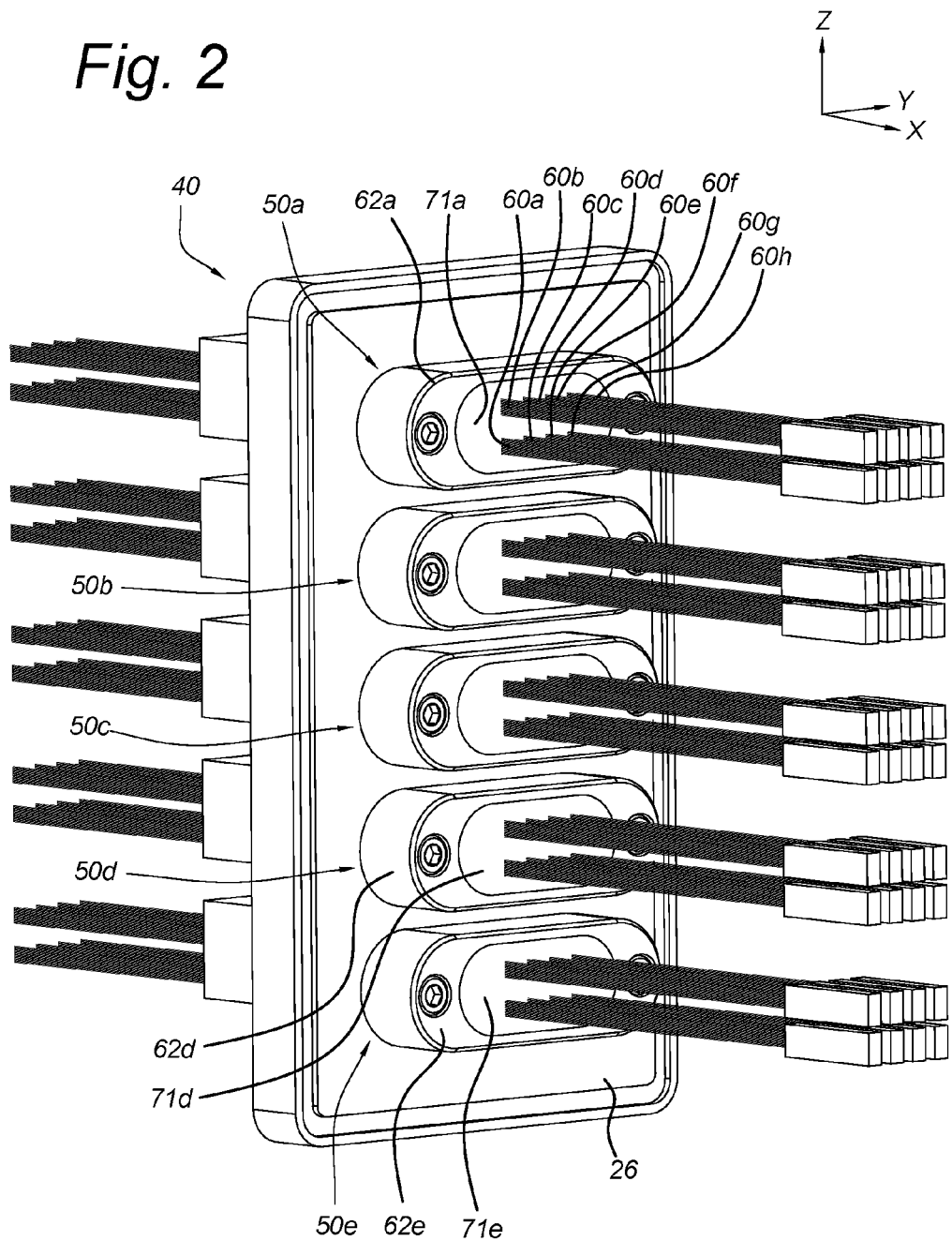
FIG. 2 shows a perspective view of an embodiment of an optical fiber path arrangement, including five fiber feedthrough devices.

FIG. 2 schematically shows an exemplary embodiment of an optical fiber path arrangement 40 in the target processing system 10 from FIG. 1. In this example, the fiber path arrangement 40 includes five fiber feedthrough devices 50a-50e. In other embodiments, the fiber path arrangement may include any positive integer number of feedthrough devices. In this example, the optical fiber path arrangement 40 comprises a flat panel 26 with five regions onto which the five fiber feedthrough devices 50 are mounted in a hermetically sealed manner. The panel 26 itself is formed as a unit that is sealingly attachable to and removable from the lateral wall 24a of the vacuum chamber 20, to facilitate manufacturing and/or maintenance of the optical fiber path arrangement 40.

Figure 3A:
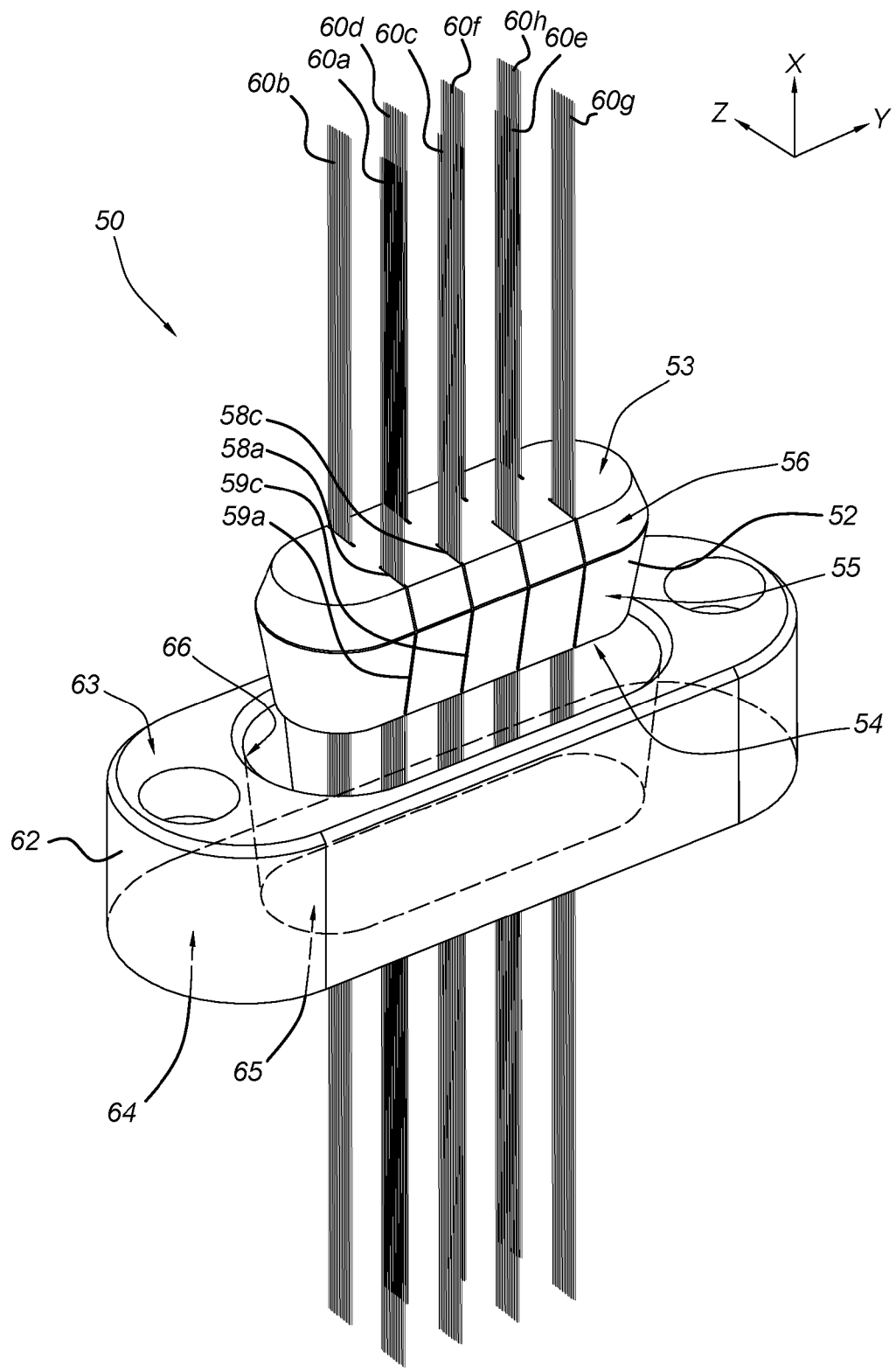
FIGS. 3a-3b show perspective views of a fiber feedthrough device according to an embodiment, and FIGS. 4a-4b schematically show perspective views of a slotted member from FIGS. 3a-3b.
Figure 3B:
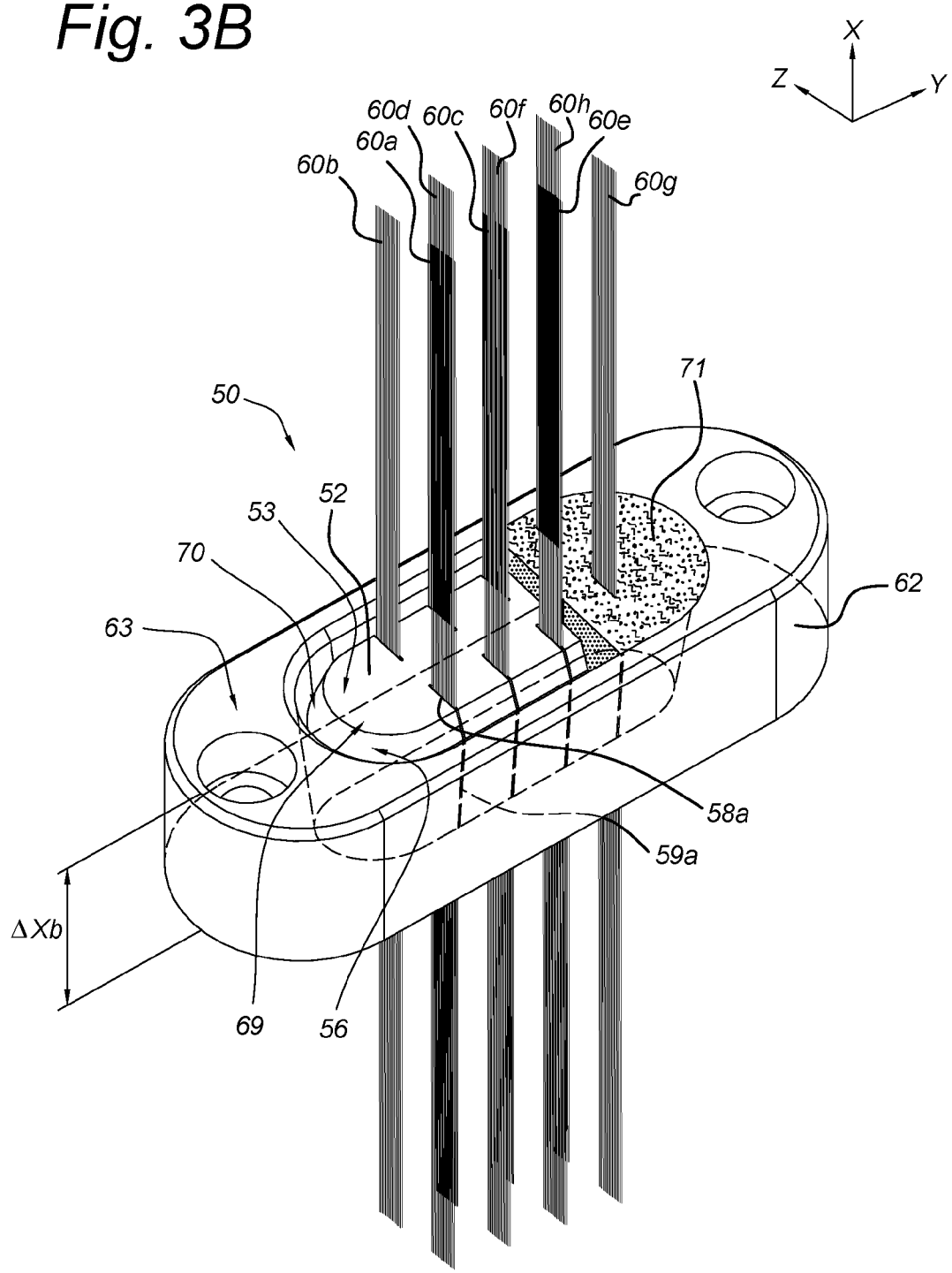

FIGS. 3a and 3b show details of a single feedthrough device 50 from the arrangement 40 of FIG. 2. The feedthrough device 50 comprises a slotted member 52, a base 62, a plurality of fiber groups 60, and a body of sealing material 71. FIG. 3a shows the feedthrough device 50 in largely disassembled state, wherein the slotted member 52 is not inserted into the base 62. FIG. 3b shows the feedthrough device 50 in an assembled state, wherein the slotted member 52 is accommodated in the base 62, and the sealing body 71 is applied (only partly shown for illustration purposes). Features described above with reference to FIG. 1 are also present in the arrangement shown in FIGS. 2 and 3a-3b.

In FIG. 2, the optical fiber path arrangement 40 is shown from a position corresponding to the outer region 22 i.e. outside the vacuum chamber 20. Each of these feedthrough devices 50 includes a slotted member 52 (see FIG. 3a), which is accommodated in a through hole 65 of an associated base 62, and covered by a corresponding sealing body 71. Each such slotted member 52 forms a passageway for a plurality of flat fiber groups 60. The fiber groups 60 extend with longitudinal portions along a first direction X (also indicated as feedthrough direction) through associated slotted members 51 of corresponding feedthrough devices 50. FIGS. 2-3b only indicate fiber groups 60a-60h, which are associated with the uppermost feedthrough device 50a. The sealing bodies 71 cover portions of corresponding feedthrough devices 50 where the fiber groups 60 exit these devices 50, and locally envelop the fiber groups 60 to provide material barriers that hermetically separate the inner region 21 of the vacuum chamber 20 from the outer region 22. In this example, the inner region 21 is located at a side of the panel 26 that faces towards a negative feedthrough direction −X, and the outer region 22 is located at a side of the panel 26 that faces towards a positive feedthrough direction +X.

FIG. 3a illustrates that the slotted member 52 is formed by a body of solid material, which in this example consists essentially of aluminum. Along the positive and negative feedthrough directions ±X, the slotted member 52 is delimited by the first surface 53 and the second surface 54, respectively. The first and second surfaces 53, 54 are located on essentially opposite sides of the slotted member 52. Along second and third directions Y, Z, the slotted member 52 is delimited by a side surface 55, 56 that extends along the entire periphery of the slotted member 52.

Cross-sectional outer contours of this side surface 55, 56 in transverse YZ-planes resemble stadium shapes. A stadium is a two-dimensional geometric figure composed of a rectangle with semicircles at two opposite sides, with a periphery including two linear segments that interconnect two semi-circular segments. The stadium-shaped cross-sections of the side surface 55, 56 may include one or more small recesses and/or protrusions, though.

The side surface 55, 56 of the slotted member 52 has a first tapered surface segment 55 bordering on the second surface 54, and a second tapered segment 56 bordering on the first surface 53. The tapered shapes imply that the (stadium-shaped) cross-sectional outer contours of each of the surface segments 55, 56 in transverse YZ-planes are congruent, and increasing in size (first segment 55) or decreasing in size (second segment 56) as a function of position along the positive feedthrough direction +X.

The slotted member 52 defines a plurality of slots 58. Each slot 58 forms a substantially flat cut-out, which extends entirely through the solid body of the slotted member 52 along the feedthrough direction X. Each group 60 of fibers is accommodated within an associated slot 58.

The base 62 is formed by a distinct body, which is also formed of a solid material. In this example, the base 62 also consists essentially of aluminum. The base 62 defines a first outer surface 63 and a second outer surface 64 on essentially opposite sides, viewed along the feedthrough direction X. In this example, the first and second outer surfaces 63, 64 are flat and substantially parallel. A distance between the first and second surfaces 63, 64 corresponds to a thickness ΔXb of the base 62, which in this example is about 20 millimeters. In use, the base 62 is rigidly fixed to the panel 26 and sealed with respect to this panel e.g. by means of an O-ring (not shown) provided on the second outer surface 64.

The base 62 defines a central through hole 65, which extends entirely through the base 62. The through hole 65 opens into the first outer surface 63 at one end, and into the second outer surface 64 at the opposite end. Along the second and third directions Y, Z, the through hole 65 is delimited by an inner surface 66 of the base 62. This inner surface 66 also has a tapered stadium shape. This stadium-shaped inner surface 66 is predominantly congruent with the first side surface segment 55 of the slotted member 52. In this way, the slotted member 52 can be arranged inside the aperture 65 of the base 62 in a form-fitting manner.

FIG. 3b shows the slotted member 52 arranged in a form-fitting manner inside the through hole 65. In this assembled state, the first side surface segment 55 of the slotted member 52 and the inner surface 66 of the base 62 abut, and the inner surface 66 covers the parts of the longitudinal openings 59 that are located at the first side surface segment 55.

In the assembled state, the first surface 53 of the slotted member 52 is receded with respect to the first surface 63 of the base 62. The first surface 53 of the slotted member 52 and part of the inner surface 66 of the base 62 jointly define a receptacle 69. In this example, the receptacle 69 is predominantly stadium-shaped.

In order to form the sealing body 71, the receptacle 69 is initially filled with a sealant material. In this example, the receptacle 69 is filled up to the level of the first surface 63. After curing, this sealant material forms the sealing body 71. This sealing body 71 covers the first surface 53 and the second surface segment 56 of the slotted member 52, as well as the parts of the slots 58 where the fiber groups 60 exit the slots 58, to envelop the fiber groups 60. In FIG. 3b, only part of the sealing body 71 is shown for illustrative purposes. It should be understood that, in this example, the completed sealing body 71 occupies the entire space of the receptacle 69, to cover all slots 58 and envelop all fiber groups 60 in a sealing manner.

Figure 4A:
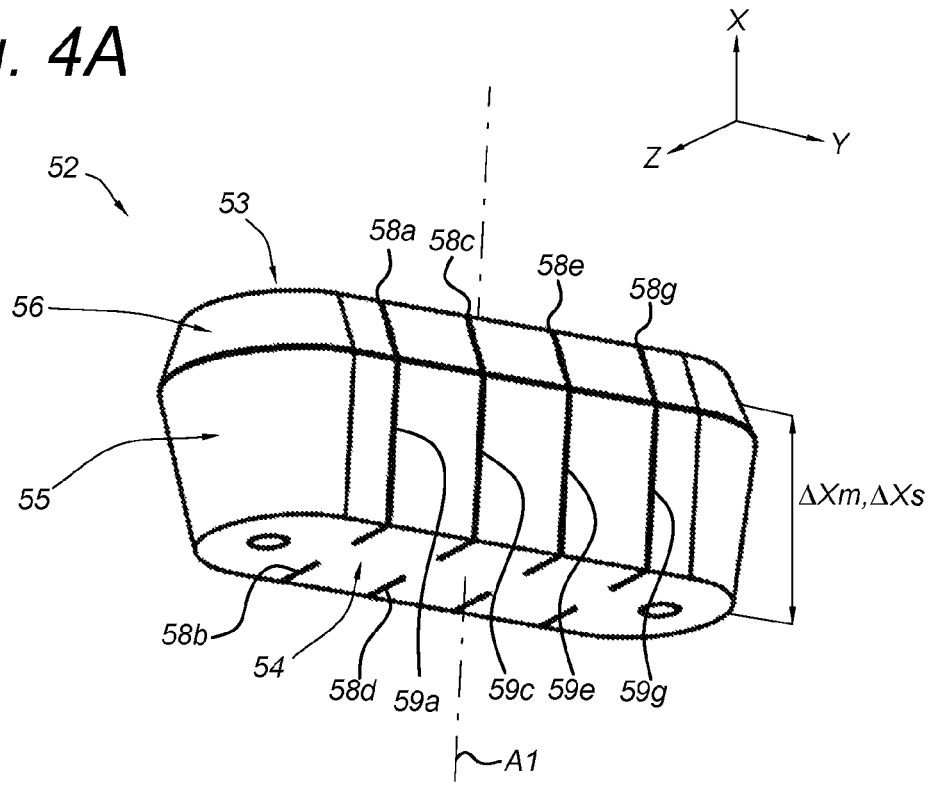
Figure 4B:
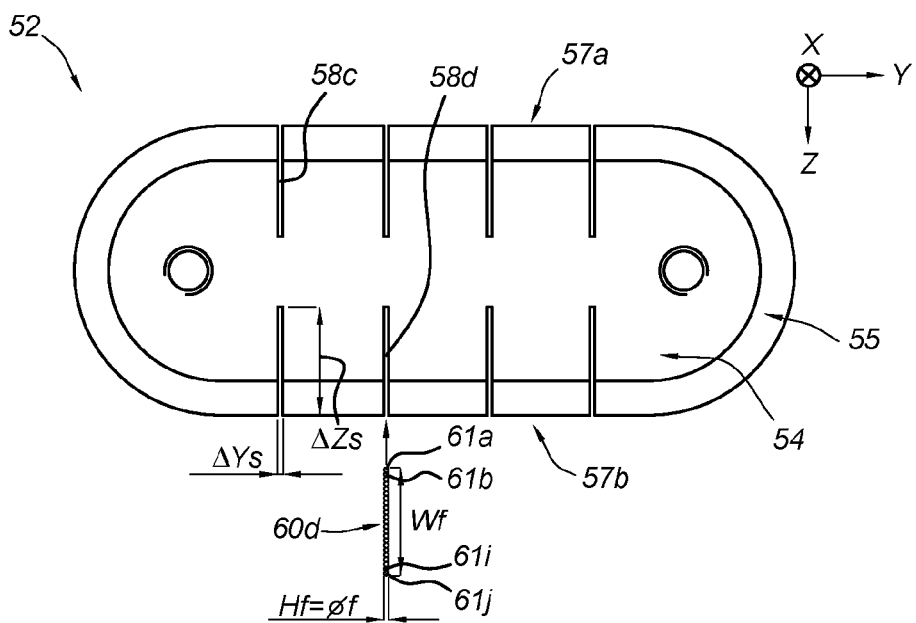

FIGS. 4a-4b schematically show more details of the slotted member 52 from FIGS. 3a-3b. Each slot 58 in the slotted member 52 extends entirely through the solid body of the slotted member 52 along the feedthrough direction X, between the first surface 53 and the second surface 54. A distance between the first surface 53 and second surface 54 of the slotted member 52 corresponds with a thickness ΔXm of the slotted member 52. In this example, the slotted member thickness ΔXm about 17 millimeters. The length ΔXs of the slot 58 in the feedthrough direction X is identical to the thickness ΔXm of the slotted member 52. The thickness ΔXb of the base 62 along the feedthrough direction X is sufficient to allow the parts of the longitudinal openings 59 that are located at the first side surface segment 55 to be covered by the inner surface 66.

FIG. 4a illustrates that the slots 58 also open into longitudinal openings 59, which extend along the entire side surface 55, 56 of the slotted member 52, thus intersecting both the first tapered side surface segment 55 and the second tapered side surface segment 56. These longitudinal openings 59 are provided on both linear portions 57a, 57b (see FIG. 4b) of the side surface 55, 56 of the slotted member 52.

FIG. 4b illustrates interrelations between the slots 58 and the fiber groups 60 in more detail. The individual fibers 61 in one fiber group 60 are laterally arranged in a linear array. In this example, each fiber group 60 is formed by at least twenty fibers 61, which extend alongside each other in a single-layered array of co-directional and abutting fibers 61. The fibers 61 locally extend in a mutually parallel manner, so that the local tangent vectors of the fibers 61 point in the same direction (here along the feedthrough direction X). Each individual fiber 61 has only two directly neighboring fibers 61. The exception to this are the first fiber 61a and the last fiber 61j, which are arranged at the two sides of the fiber group 60, and which have only one directly neighboring fiber (i.e. the second fiber 61b and the penultimate fiber 61i respectively). The optical fibers 61 have essentially identical fiber diameters Øf. The fiber diameter Øf may be in a range of about 0.125 millimeters to 0.25 millimeters. In this example, the fiber diameter Øf has a value of about 0.175 millimeters. As a result, a thickness Hf of the fiber group 60 along the second direction Y is substantially equal to the fiber diameter Øf, and a width Wf of the fiber group 60 along the third direction Z is at least twenty times the fiber diameter Øf.

Each slot 58 extends perpendicularly into the slotted member 52, here along the (positive/negative) third direction Z (also indicated as the depth direction Z). The slot 58 has a depth ΔZs in this depth direction Z, which is at least equal to the group width Wf (i.e. at least twenty times the fiber diameter Øf in this example). The slot 58 has a width ΔYs in the second direction Y, which complies with Øf<ΔYs<2·Øf. In this example, the slot width ΔYs is only marginally larger than the fiber diameter Øf, and has a value of about 0.25 millimeters. When accommodated inside the corresponding slot 58, the fibers 61 will not cross each other, at least along the entire extent of the slot 58.

The optical fibers 61 are coated on outer surfaces with aluminum, to reduce outgassing effects inside the vacuum chamber 20. This aluminum coating also facilitates adhesion of the sealing body 71 to the slotted member 52, the base 62, and the optical fibers 61.

In alternative embodiments, some or all of the fibers in one fiber group do not directly abut in a lateral direction (here, in the depth direction Z). Instead, some or all pairs of directly neighboring fibers may extend alongside each other while defining a small space in between. Such spaces allow a larger portion of the transverse cross-sectional peripheries of corresponding fibers to be enveloped by the sealing body (e.g. cured sealant material). In such embodiments, a width Wf of the fiber group will exceed the product of the number of fibers in the group and the fiber diameter Øf.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. It will be apparent to the person skilled in the art that alternative and equivalent embodiments of the invention can be conceived and reduced to practice. All changes which come within the meaning and range of equivalency of the claims are to be embraced within their scope.

Those skilled in the art and informed by the teachings herein will realize that the invention is applicable for feeding through any number of flat fiber groups comprising multiple fibers. Any number of fiber path arrangements may be used, and each arrangement may include any number of feedthrough devices.

The proposed fiber feedthrough device and/or optical fiber path arrangement may be employed in various types of vacuum chambers and/or target processing systems. The target processing system may for example be a charged particle beamlet lithography system, an electromagnetic beam lithography system, or another type of processing system that requires a hermetic feedthrough of optical fibers between regions with different ambient conditions.

Apart from the above, it will be appreciated that the cross-sectional shapes of the side surface of the slotted member and the inner surface of the base of a feedthrough device do need to be shaped according to a stadium. Instead, other shapes may be possible, for example rounded rectangular, elliptic, circular, polygonal, or other cross-sectional shapes.

LIST OF REFERENCE SYMBOLS 10 target processing system (e.g. lithography system)
12 system controller
14 optical signal generators
16 optical fiber cabling
17 first fiber cable segment (external)
18 second fiber cable segment (intermediate transition)
19 third fiber cable segment (internal)
20 vacuum chamber
21 first region (e.g. vacuum chamber region)
22 second region (e.g. outer region)
23 upper chamber wall
24 lateral chamber wall
26 feedthrough wall section
28 target
30 particle beam column
32 particle beam source (e.g. electron beam source)
34 particle beam collimator
36 beamlet switcher module
37 blanker controller
38 beamlet
40 optical fiber path arrangement
42 first connector (e.g. internal connector)
44 second connector (e.g. external connector)
50 feedthrough device
52 slotted member
53 first surface
54 second surface
55 first side surface segment
56 second side surface segment
57 flat surface portion
58 slot
59 longitudinal opening
60 flat fiber group
61 optical fiber
62 base
63 first surface
64 second surface
65 through hole (for slotted member)
66 inner surface
67 coupling aperture (e.g. lateral through hole)
68 mechanical coupling (e.g. bolt and nut)
69 receptacle
70 peripheral recess
71 sealing body
72 main seal portion
73 flange seal portion
A1 insertion axis
X first direction (feedthrough direction)
Y second direction (transversal direction)
Z third direction (e.g. depth direction)
ΔXm slotted member thickness
ΔXb base thickness
ΔXs slot length
ΔYs slot width
ΔZs slot depth
Wf fiber group width
Hf fiber group thickness
Øf fiber diameter

What is claimed is:

1. An optical fiber feedthrough device for forming a hermetic seal around a plurality of optical fibers, the optical fibers extending alongside each other to form a flat fiber group with a group width, wherein the feedthrough device comprises:
a slotted member, which defines a first outer surface that faces predominantly towards a feedthrough direction, a second surface that faces predominantly opposite to the feedthrough direction, and a side surface that interconnects the first and second surfaces and faces outwards transverse to the feedthrough direction;
a base with a hole that extends entirely through the base along the feedthrough direction, wherein the hole is adapted to accommodate the slotted member;
wherein the slotted member further comprises at least one slot, which extends along the feedthrough direction through the slotted member and opens into the first and second surfaces, to allow the fiber group to pass from the first surface through the slotted member to the second surface, wherein the slot further opens into a longitudinal opening along the side surface, and extends from the side surface along a depth direction transverse to the feedthrough direction up to a slot depth into the slotted member, wherein the slot depth is equal to or larger than the group width.

2. The optical fiber feedthrough device according to claim 1, wherein the base defines an inner surface that directly surrounds the hole, wherein the inner surface covers at least part of the side surface and the longitudinal opening of the slotted member, when accommodated in the hole.

3. The optical fiber feedthrough device according to claim 2, wherein the first surface of the slotted member is recessed along the feedthrough direction relative to a surface of the base directly around the hole, when the slotted member is accommodated in the hole, so that at least the first surface of the slotted member and the inner surface of the base form a receptacle in which a sealing body can be accommodated.

4. The optical fiber feedthrough device according to claim 2, wherein the side surface of the slotted member has a cross-sectional shape that resembles a stadium or a rounded rectangle, and wherein the inner surface of the base around the though hole has cross-sectional shape adapted to accommodate the slotted member in a form-fitting manner.

5. The optical fiber feedthrough device according to claim 1, wherein the side surface of the slotted member defines a flat surface portion that extends in a translationally symmetric manner along a direction perpendicular to the feedthrough direction, wherein the longitudinal opening is located at the flat surface portion, and wherein the at least one slot extends along the depth direction and perpendicular to the flat surface portion into the slotted member.

6. The optical fiber feedthrough device according to claim 2, wherein the side surface of the slotted member defines a first side surface segment that is inwardly tapered towards an axis along the feedthrough direction, and wherein the inner surface of the base is inwardly tapered congruent to the first side surface segment.

7. The optical fiber feedthrough device according to claim 6, wherein the side surface of the slotted member includes a second outer surface segment that is inwardly tapered, filleted, or chamfered towards the axis along the feedthrough direction but oppositely with respect to the first side surface segment, and/or wherein the inner surface of the base includes an inner surface segment that is outwardly tapered, filleted, or chamfered away from the axis, such that the second side surface segment and/or inner surface segment define an inwards peripheral recess directly bordering on the at least one longitudinal opening in the slotted member, the recess configured to accommodate a portion of the sealing body.

8. An optical fiber path arrangement, comprising:
an optical fiber feedthrough device with a slotted member and a base according to claim 1, wherein the slotted member is accommodated in the hole of the base;
a plurality of optical fibers, which extend alongside each other to form a flat fiber group with a group width, wherein the fiber group is arranged with a longitudinal portion inside a slot of the slotted member, to extend in a feedthrough direction between the first and second surfaces of the slotted member through the fiber feedthrough device, and
a sealing body covers the first surface of the slotted member and at least the part of the slot where the fiber group exits the slot, to envelop the fiber group and provide a hermetic barrier between first and second regions that are outside the slotted member and border on the first and second surfaces of the slotted member respectively.

9. The optical fiber path arrangement according to claim 8, comprising further optical fibers, which extend alongside each other in arrays to form further fiber groups with group widths;
wherein the slotted member includes further slots, which extend along the feedthrough direction through the slotted member and open into the first and second surfaces to allow the fiber groups to pass from the first surface through the slotted member to the second surface;
wherein each further slot opens into a respective longitudinal opening along the side surface, and extends from the side surface up to a slot depth into the slotted member, and
wherein the longitudinal openings are provided on the same and/or on opposite flat surface portions of the side surface of the slotted member, and the sealing body covers all slots to form the hermetic barrier.

10. The optical fiber path arrangement according to claim 8, wherein the hole of the base defines an inner surface that directly surrounds the hole, wherein the base accommodates the slotted member in the hole, and the inner surface of the base covers at least part of the side surface and the longitudinal opening of the slotted member.

11. The optical fiber path arrangement according to claim 10, wherein the first surface of the slotted member is recessed along the feedthrough direction relative to a surface of the base directly around the hole, so that at least the first surface of the slotted member and the inner surface of the base form a receptacle in which the sealing body is accommodated.

12. The optical fiber path arrangement according to claim 10, wherein the side surface of the slotted member has a cross-sectional shape that resembles a stadium or a rounded rectangle, and wherein the inner surface of the base around the though hole has a cross-sectional shape adapted to accommodate the slotted member in a form-fitting manner.

13. The optical fiber path arrangement according to claim 10, wherein the side surface of the slotted member defines a first side surface segment that is inwardly tapered towards an axis along the feedthrough direction, and wherein the inner surface of the base is inwardly tapered congruent to the first side surface segment.

14. The optical fiber path arrangement according to claim 8, wherein the optical fibers have a fiber diameter Øf and are arranged alongside each other into a single-layered array, to form the fiber group with a group thickness that is at least equal to the fiber diameter but smaller than twice the fiber diameter.

15. The optical fiber path arrangement according to claim 14, wherein the slot has a slot width ΔYs transverse to both the feedthrough direction and the slot depth, wherein the slot width is within a range defined by Øf<ΔYs<2·Øf.

16. The optical fiber path arrangement according to claim 8, wherein the slotted member and the base form rigid bodies comprising one or more solid materials, wherein the sealing body is formed from liquid sealant material that adheres to the one or more solid materials and fixes the slotted member to the base when cured, and wherein the optical fibers are coated with a material that is essentially the same as the material of the slotted member.

17. The optical fiber path arrangement according to claim 8, wherein the fiber group and/or further fiber groups comprise a first connector at a first end that is located in the first region, and/or comprise a second connector at an opposite second end that is located in the second region.

18. A vacuum chamber, comprising at least one wall and an optical fiber path arrangement provided at or in the wall, wherein the optical fiber path arrangement comprises:
an optical fiber feedthrough device with a slotted member and a sealing body according to claim 1, and
a plurality of optical fibers, which extend alongside each other to form a flat fiber group;

wherein the fiber group is arranged with a longitudinal portion that extends inside a slot of the slotted member, in a feedthrough direction between first and second surfaces of the slotted member through the fiber feedthrough device, to feed the fiber group through the wall and between first and second regions on opposite sides of the wall;

wherein the sealing body covers the first surface of the slotted member and at least the part of the slot where the fiber group exits the slot, to envelop the fiber group and provide a hermetic barrier between the first and second regions.

19. A target processing system, wherein the target processing system comprises a vacuum chamber with at least one wall and an optical fiber path arrangement provided at or in the wall, wherein the optical fiber path arrangement comprises:

an optical fiber feedthrough device with a slotted member and a sealing body according to claim 1, and a plurality of optical fibers, which extend alongside each other to form a flat fiber group;

wherein the fiber group is arranged with a longitudinal portion that extends inside a slot of the slotted member, in a feedthrough direction between first and second surfaces of the slotted member through the fiber feedthrough device, to feed the fiber group through the wall and between first and second regions on opposite sides of the wall;

wherein the sealing body covers the first surface of the slotted member and at least the part of the slot where the fiber group exits the slot, to envelop the fiber group and provide a hermetic barrier between the first and second regions.

20. The target processing system according to claim 19, formed as a lithography processing system.

21. The target processing system according to claim 19, configured to generate and project beams of radiation towards a target inside the vacuum chamber, and comprising a beam switching module that is arranged inside the vacuum chamber and configured to modulate and/or select beams for projection onto the target based on control signals, wherein the optical fiber path arrangement is adapted to transmit the control signals from a control unit external to the vacuum chamber, via the optical fibers that extend through the hermetic fiber feedthrough device, to the beam switching module.

* * * * *